(12) United States Patent
Pellerano et al.

(10) Patent No.: US 7,605,625 B2
(45) Date of Patent: Oct. 20, 2009

(54) DEVICE, SYSTEM AND METHOD OF DELAY CALIBRATION

(75) Inventors: Stefano Pellerano, Beaverton, OR (US); Georgios Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 11/868,500

(22) Filed: Oct. 7, 2007

(65) Prior Publication Data
US 2009/0091362 A1    Apr. 9, 2009

(51) Int. Cl.
*H03L 7/08* (2006.01)
*H03L 7/06* (2006.01)

(52) U.S. Cl. .................. 327/158; 327/161; 327/271; 327/277

(58) Field of Classification Search .......... None
See application file for complete search history.

(56) References Cited

U.S. PATENT DOCUMENTS 6,194,928 B1 * 2/2001 Heyne .................. 327/152
7,154,978 B2 * 12/2006 Juan et al. .................. 375/376
7,355,380 B2 * 4/2008 Abuhamdeh et al. ...... 324/76.54
7,439,787 B2 * 10/2008 Hashim et al. .............. 327/172

OTHER PUBLICATIONS

Chan-Hong Park, Ook Kim, and Beomsup Kim, "A 1.8-GHz Self-Calibrated Phase-Locked Loop with Precise I/Q Matching," in IEEE Journal of Solid-State Circuits, vol. 36, Issue 5, May 2001, pp. 777-783.

* cited by examiner

*Primary Examiner*—Lincoln Donovan
*Assistant Examiner*—Terry L Englund
(74) *Attorney, Agent, or Firm*—Shiloh Buchek PLLC

(57) ABSTRACT

System and method of calibrating delay mismatch for high-spectral purity applications. For example, a method includes measuring the delay of one delay element at a time in a fixed topology by moving a time reference generated by an auxiliary delay-locked loop. The auxiliary DLL may have a replica structure of the primary DLL being calibrated. The calibration method uses one output clock signal of the primary DLL and measures delay mismatch using a reference phase previously measured using the same topology. The calibration method takes into account all delay mismatches in the topology up to the primary DLL output clock signal, including any delay generated by an associated multiplexer.

13 Claims, 4 Drawing Sheets

DEVICE, SYSTEM AND METHOD OF DELAY CALIBRATION

BACKGROUND

Voltage-controlled or current-controlled delay cells have numerous applications in circuit design. In delay-locked loops (DLLs) a cascade of delay cells forms a delay line that is controlled through feedback action by a charge pump and/or a phase detector to set the overall delay to a specific value. Controllable-delay cells are also used in ring oscillators. Multi-stages DLLs or ring oscillators are used to generate multi-phase signals. Multi-stage DLLs are further used to implement a frequency divider or multiplier with a fractional division or multiplication ratio, for example, by using a multiplexer known as an edge-combiner.

In typical implementations, process variations may produce considerable mismatches between the multiple delay cells that form the DLL or the ring oscillator. This may cause an error in the different phases generated through the DLL or ring oscillator. For example, a mismatch in the delay of the stages may cause frequency spurs. Furthermore, if the phase difference between the various outputs is not equal, a periodic time error may appear at the output. These spurs may substantially limit the application of the DLL as a frequency divider/multiplier where high spectral purity clock is required. For example, if one of the multiple delay cells exhibits a delay mismatch of approximately 10 percent, the power of the output spur would be approximately −32 dBc (namely, approximately 0.32 decibels below the carrier). However, some wireless communication standards may require spurs to be as low as −65 dBc for the local oscillator.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
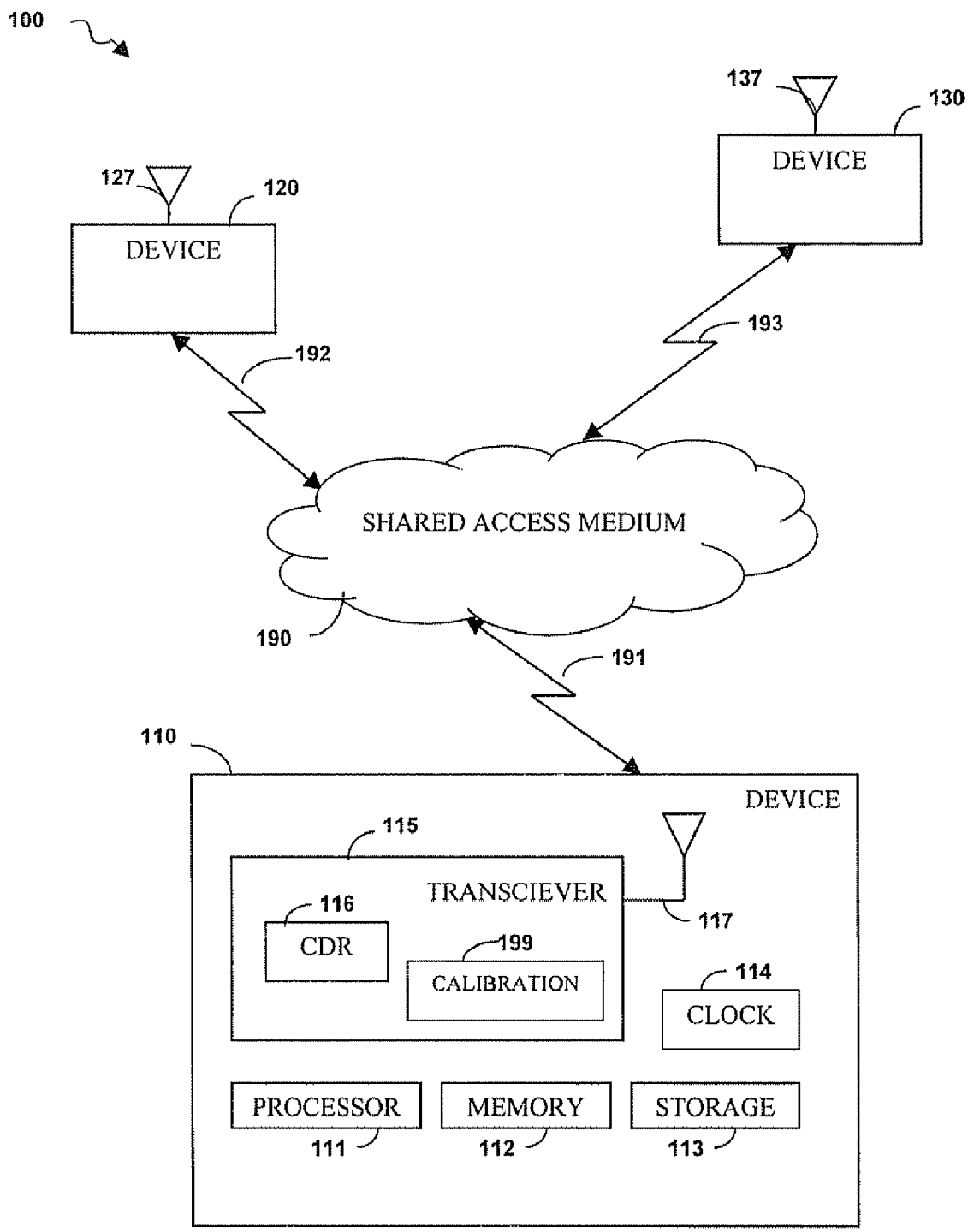
FIG. 1 is a schematic block diagram illustration of a communication system in accordance with a demonstrative embodiment of the invention.

In the following detailed description, numerous specific details are set forth in order to provide a thorough understanding of some embodiments of the invention. However, it will be understood by persons of ordinary skill in the art that embodiments of the invention may be practiced without these specific details. In other instances, well-known methods, procedures, components, units and/or circuits have not been described in detail so as not to obscure the discussion.

Some embodiments of the invention may be used in conjunction with various devices and systems, for example, a transmitter, a receiver, a transceiver, a transmitter-receiver, a wireless communication station, a wireless communication device, a wireless access point (AP), a modem, a wireless modem, a personal computer, a desktop computer, a mobile computer, a laptop computer, a notebook computer, a tablet computer, a handheld computer, a server computer, a personal digital assistant (PDA) device, a handheld PDA device, a network, a wireless network, a local area network (LAN), a wireless LAN (WLAN), a metropolitan area network (MAN), a wireless MAN (WMAN), wide area network (WAN), wireless WAN (WWAN), a personal area network (PAN), a wireless PAN (WPAN), devices and/or networks operating in accordance with existing Institute of Electrical and Electronics Engineers (IEEE) standards such as IEEE 802.11, 802.11a, 802.11b, 802.11g, 802.11n, 802.16, 802.16d, 802.16e, and other derivatives, long-term evolution (LTE) standards and/or future versions of the above standards, units and/or devices which are part of the above networks, one way and/or two-way radio communication systems, cellular radio-telephone communication systems, a cellular telephone, a cellular smartphone, a wireless telephone, a personal communication systems (PCS) device, a PDA device which incorporates a wireless communication device, a mobile or portable global positioning system (GPS) device, a device which incorporates a GPS receiver or transceiver or chip, a device which incorporates a radio frequency identification element or chip, a multiple input multiple output (MIMO) transceiver or device, a single input multiple output (SIMO) transceiver or device, a multiple input single output (MISO) transceiver or device, a multi receiver chain (MRC) transceiver or device, a transceiver or device having "smart antenna" technology or multiple antenna technology, a device having one or more internal antennas and/or external antennas, a wired or wireless handheld device, a wireless application protocol (WAP) device, or the like.

In some embodiments, the system and method disclosed herein may be implemented in many wireless, handheld and portable communication devices. By way of example, wireless, handheld and portable communication devices may include wireless and cellular telephones, smart telephones, personal digital assistants (PDAs), web-tablets and any device that may provide wireless access to a network such, an intranet or the internet. Some embodiments of the invention may be used in conjunction with one or more types of wireless communication signals and/or systems, for example, radio frequency (RF), infra red (IR), frequency-division multiplexing (FDM), orthogonal FDM (OFDM), orthogonal frequency-division multiple access (OFDMA), s-OFDMA, time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, multi-carrier modulation (MDM), discrete multi-tone (DMT), Bluetooth®, global positioning system (GPS), WiFi, WiMax, ZigBee™, ultra-wideband (UWB), global system for mobile communication (GSM), 2G, 2.5G, 3G, 3.5G, or the like. Embodiments of the invention may be used in various other devices, systems and/or networks.

Discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes. In addition, the terms "plurality" and "a plurality" as used herein include, for example, "multiple" or "two or more". The terms "plurality" or "a plurality" may be used throughout the specification to describe two or more components, devices, elements, units, parameters, or the like.

Although portions of the discussion herein may relate, for demonstrative purposes, to a wireless communication system, a wireless transmitter and/or a wireless receiver, embodiments of the invention are not limited in this regard, and may be used, for example, in conjunction with non-wireless (e.g., wired) communication systems, transmitters and/or receivers, for example, PCI (Peripheral Component Interconnect) Express (PCIe) communications and/or systems.

FIG. 1 schematically illustrates a communication system 100 in accordance with some demonstrative embodiments of the invention. System 100 may include one or more communication stations or devices, for example, devices 110, 120, and 130. System 100 may optionally include other communication devices, for example, a wireless access point (AP), a base station, a servicing station, or the like. Devices 110, 120, and 130 may communicate using a shared access medium 190, for example, through wireless communication links 191, 192, and 193 respectively.

In some embodiments, system 100 may be or may include one or more wireless communication networks, for example, an asynchronic wireless network, an asynchronous wireless network, a synchronic wireless network, a burstable wireless network, a non-burstable wireless network, a hybrid network, a combination of one or more networks, or the like. In some other embodiments, system 100 need not be implemented as a wireless communication system, and may be implemented, for example, as a computing platform, a processing platform, a PCIe device, a PCIE transmitter/receiver, a Serializer/Deserializer (SerDes) device, a SerDes transmitter/receiver, or the like.

Devices 110, 120, and 130 may each be associated with one or more radio frequency antennas, for example, antennas 117, 127, and 137, respectively, to facilitate communication via wireless links 191-193. Each of antennas 117, 127, and 137 may include or may be, for example, an internal and/or external RF antenna, a dipole antenna, a monopole antenna, an omni-directional antenna, an end-fed antenna, a circularly polarized antenna, a micro-strip antenna, a diversity antenna, or any other type of antenna suitable for transmitting and/or receiving wireless communication signals, blocks, frames, transmission streams, packets, messages and/or data. Optionally, each of antennas 117, 127, and 137 may be implemented using a common antenna, a common set of multiple antennas, or other suitable component(s).

Wireless links 191-193 may each include a downlink and an uplink for carrying traffic between a transmitting device and a receiving device. The network traffic carried via links 191-193 may include packets, flames, or other collections of signals and/or data, such as, for example, media access controller (MAC) protocol data units (MPDUs) and/or physical layer (PHY) protocol data units (PPDUs), that may make up a transmission of wireless signals.

Device 110 may be or may include, for example, a computing station, a computing device, a computer, a personal computer (PC), a server computer, a client/server system, a mobile computer, a portable computer, a laptop computer, a notebook computer, a tablet computer, a mobile phone, a cellular phone, a handheld device, a network of multiple inter-connected devices, or the like.

Device 110 may include, for example, a processor 111, a memory unit 112, a storage unit 113, a clock 114, and a transceiver 115. Device 110 may optionally include other suitable hardware components and/or software components. In some embodiments, some or all of the components of device 110 may be enclosed in a common housing or packaging, and may be interconnected or operably associated using one or more wired or wireless links. In other embodiments, components of device 110 may be distributed among multiple or separate sub-units, devices or locations.

Processor 111 includes, for example, a central processing unit (CPU), a digital signal processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an integrated circuit (IC), an application-specific IC (ASIC), a CMOS chip, or any other suitable multi-purpose or specific processor or controller. Processor 111 may executes instructions, for example, of an operating system (OS) of device 110 or of one or more applications.

Memory unit 112 includes, for example, a random access memory (RAM), a read only memory (ROM), a dynamic RAM (DRAM), a synchronous DRAM (SD-RAM), a flash memory, a volatile memory, a non-volatile memory, a cache memory, a buffer, a short-term memory unit, a long-term memory unit, or other suitable memory units. Storage unit 113 includes, for example, a hard disk drive, a floppy disk drive, a compact disk (CD) drive, a CD-ROM drive, a digital versatile disk (DVD) drive, or other suitable removable or non-removable storage units. Memory unit 112 and/or storage unit 113, for example, may store data processed by station 110.

Clock 114 may include, for example, a real-time clock, a system clock, a counter, a timer, a component able to perform timing or counting operations, a component able to track time, a component able to provide time data or time parameters, or the like. In some embodiments, clock 114 may be operationally associated with transceiver 115.

Device 110 further includes one or more transceivers, for example, a wireless transceiver 115 able to operate in accordance with IEEE 802.11 standard and/or IEEE 802.16 standard and/or other suitable wireless communication standards or protocols. In some embodiments, transceiver 115 may be a wired or wireless transceiver, for example, a PCIe transceiver or a SerDes transceiver.

Transceiver 115 may include a transmitter and/or a receiver, a transmitter-receiver, or other circuitry or sub-units able to transmit and/or receive wired or wireless signals, radio frequency (RF) signals, blocks, frames, transmission streams, packets, messages and/or data, e.g., through antenna 117. Transceiver 115 may be co-located with other communication components, for example, using a common housing, packaging, card, circuit, modem unit, wireless network interface card (NIC), or communication unit.

Transceiver 115 may include or may be operatively associated with a Clock and Data Recovery (CDR) unit 116, for example, to recover embedded clocking information in received signals. The CDR unit 116 may, for example, detect an optimal or neatly optimal sampling point of one or more data bits in the signal received by transceiver 115, and may generate a correcting signal to automatically correct the data sampling point.

CDR unit 116 may include, or may be associated with, a delay-mismatch calibrating unit 199 able to calibrate delay(s) for the CDR unit 116. The delay-mismatch calibrating unit 199 may include components and/or functionalities similar to the components and/or functionalities of system 200, as described herein with reference to FIG. 2.

Figure 2:
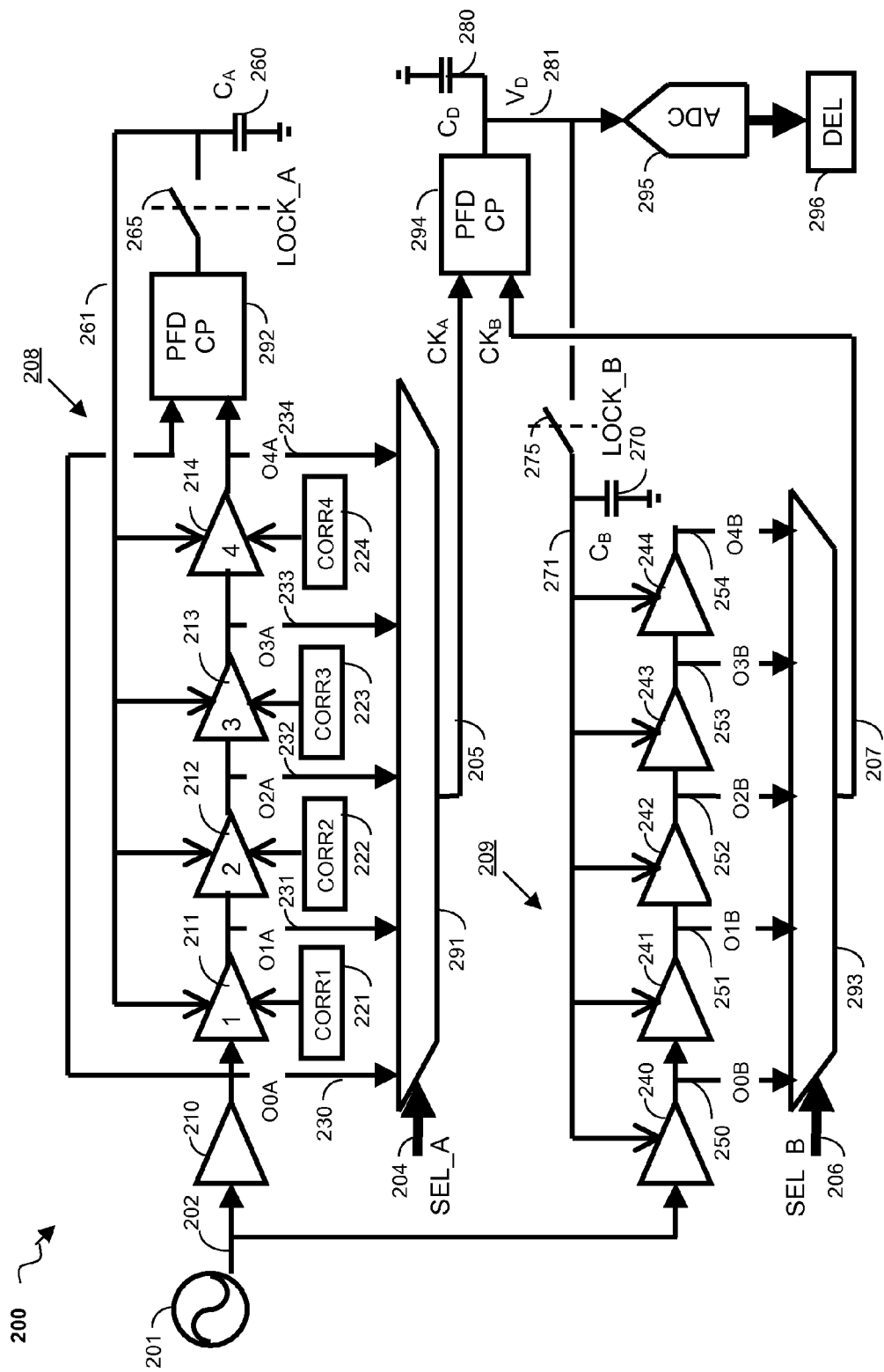
FIG. 2 is a schematic block diagram illustration of a system for delay-mismatch calibration in accordance with a demonstrative embodiment of the invention.

FIG. 2 schematically illustrates a system 200 for delay-mismatch calibration in accordance with a demonstrative embodiment of the invention. System 200 may be implemented in connection with, for example, a delay-locked loop (DLL), a phase-locked loop (PLL), a ring oscillator, a voltage-controlled oscillator (VCO), a frequency synthesizer, a fractional frequency divider, or the like. For example, system 200 may be used to calibrate delay for a CDR unit (e.g., CDR 116 of FIG. 1), a high-speed clock generation unit, or the like.

Some embodiments utilize a calibration technique and algorithm to calibrate the mismatch of several delay cells and equalize their individual delays. The technique is demonstrated herein as applied to a demonstrative DLL architecture, but it may be used to calibrate substantially any number of delay cells in other architectures where delay mismatch correction is required, such as ring oscillators, to multi-stage DLLs, and so forth.

In some embodiments, system 200 includes a clock source 201, a main (or primary) DLL 208, and an auxiliary (or replica, or secondary) DLL 209. System 200 further includes a sampling capacitor 280 (e.g., to store an output voltage 281), an analog-to-digital converter (ADC) 295 (e.g., to convert the output signal) and a memory and/or storage element 296, denoted DEL, for use in the calibration method as described herein with reference to FIGS. 3 and 4.

The main DLL 208 includes a plurality of delay elements arranged in a cascade, for example, voltage-controlled delay cells 211-214 having two separate control ports. A first control port may be controlled by the DLL feedback action to provide the same control voltage 261 for all of the delay cells 211-214. The feedback of DLL 208 may be controlled by a phase detector and/or a charge pump 292 (e.g., to set the overall delay and to align clock signal edges), a switch 265 (to lock the loop, denoted LOCK_A), and a capacitor 260 (to store the feedback voltage 261). A second control port may be used to adjust the delay of each of the delay cells 211-214 separately, for example, to compensate for mismatches between the individual delay cells 211-214. For example, in some embodiments delay cell 211 may be controlled by a correcting voltage 221, delay cell 212 may be controlled by a correcting voltage 222, delay cell 213 may be controlled by a correcting voltage 223, and delay cell 214 may be controlled by a correcting voltage 224. The correcting voltage for the second control port of each delay cell 211-214 may be calibrated according to the method described herein with reference to FIGS. 3 and 4.

The auxiliary DLL 209 may be a replica of the main DLL 208. For example, auxiliary DLL 209 may include voltage-controlled delay cells 241-244 that are replicas of delay cells 211-214, respectively. However, for the auxiliary DLL 209, the separate control ports for delay mismatch correction are not included and/or are not used. Delay cells 241-244 may be controlled by control voltage 271 based on the DLL feedback loop. The feedback of DLL 209 may be controlled by a phase detector and/or a charge pump 294 (e.g., to set the overall delay and to align clock signal edges), a switch 275 (to lock the loop, denoted LOCK_B), and a capacitor 270 (to store the feedback voltage 271).

DLLs 208 and 209 may each be associated with an additional delay element, for example, delay cells 210 and 240, respectively. Delay elements 210 and 240 may receive a clock signal 202 from the clock source 201, and delay it by a fixed or constant amount, for example, to provide an offset buffer for measuring and/or adjusting the relative delay of the first delay element in the DLL. In some embodiments, the delay cell 210 associated with the main DLL 208 may produce a delayed clock signal 230 having a fixed delay; and the delay cell 240 associated with the auxiliary DLL 209 may be adjustable, e.g., to produce a delayed clock signal 250 that is aligned with the delayed clock signal 230.

In some embodiments, DLLs 208 and 209 may be associated with multiplexers and/or edge combiners 291 and 293, respectively. In DLL 208, each of the delay cells 210-214 may output a delayed clock signal according to the delay of the respective element, for example, delayed signals 230-234 (also denoted O0A-O4A), respectively. Multiplexer 291 may be controlled by a selection signal 204 (denoted SEL_A) to select which of the delayed clock signals 230-234 is output as a clock signal 205, denoted $CK_A$. In DLL 209, each of the delay cells 240-244 may output a delayed clock signal according to the delay of the respective element, for example, delayed signals 250-254 (also denoted O0B-O4B), respectively. Multiplexer 293 may be controlled by a selection signal 206 (denoted SEL_B) to select which of the delayed clock signals 250-254 is output as a clock signal 207, denoted $CK_B$. Signals $CK_A$ and $CK_B$ may be used as input to the phase detector with charge pump 294.

Figure 3:
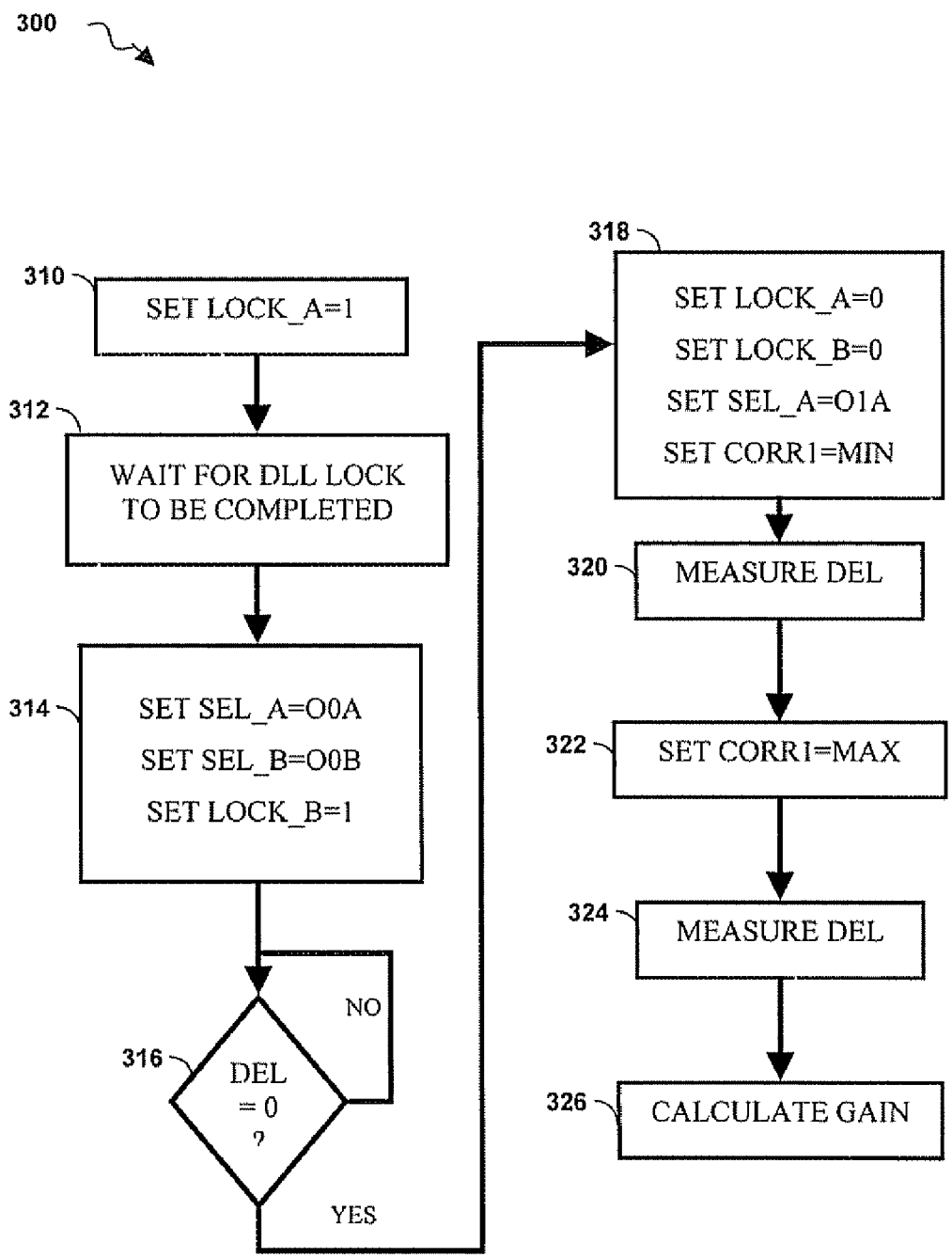
FIG. 3 is a schematic flow-chart of a method of estimating gain in accordance with a demonstrative embodiment of the invention.

FIG. 3 is a schematic flow-chart of a method 300 of estimating gain in accordance with a demonstrative embodiment of the invention. Operations of the method may be used, for example, by system 200 of FIG. 2 and/or by other suitable units, devices and/or systems. In some embodiments, method 300 may be used to estimate the gain (in terms of seconds of delay per volt of applied control signal, s/V) of a port used to correct delay mismatches, for example, the gain of one or more of correction ports 221-224 of FIG. 2 (also denoted corr1-corr4).

As indicated at block 310, the loop in the main DLL 208 is closed (lock_A=1), e.g., using switch 265, and sufficient time is waited to let the loop to properly lock (block 312). As indicated at block 314, when the main DLL 208 is completely locked, outputs O0A (from delay element 210 of DLL 208) and O0B (from delay element 240 of DLL 209) are selected using the multiplexer controls SEL_A and SEL_B, respectively. The auxiliary loop 209 is closed (lock_B=1), e.g., using switch 275, to allow for lock. Capacitor 280 ($C_D$) integrates the charge dumped by the PFD and charge pump 294 of the auxiliary loop for a given number of input clock cycles of $CK_A$ 205 from the main loop 208. After that, the voltage 281 ($V_D$) is sampled by the ADC 295, the value stored in the variable DEL and the capacitor $C_D$ is reset, so that the integration cycle may be restarted.

As indicated at block 316, when the sampled value of $V_D$ is zero, the system recognizes that $CK_A$ and $CK_B$ are aligned, that is, that the auxiliary loop 209 is locked. As indicated at block 318, at this point both loops may be opened. For example, switch 265 of the primary DLL may be opened (lock_A=0), with the proper control voltage preserved on capacitor 260 ($C_A$); and switch 275 of the auxiliary DLL may be opened (lock_B=0), with the proper control voltage stored on capacitor 270 ($C_B$). With both loops opened, the output O1A of the primary DLL may then be selected by SEL_A and fed to $CK_A$. Accordingly, the time difference at the input of the auxiliary PFD between $CK_A$ and $CK_B$ may now equal the delay of the cell 221 in the main DLL 208, including all the interconnections up to the output of the multiplexer 291. This delay is integrated on the capacitor $C_D$, sampled by the ADC 295 and stored in DEL. As indicated at blocks 318-324, this measurement is repeated with the correction for cell 211 set to minimum and maximum values.

As indicated at block 326, the gain for the correction port may be estimated based on the following equation, denoted Equation 1, where $del1_{max}$ and $del1_{min}$ are the delay of cell 1 measured with the maximum ($corr1_{max}$) and minimum ($corr1_{min}$) applied correction respectively:

$$\text{GAIN} \approx (del1_{max} - del1_{min})/(corr1_{max} - corr1_{min}) \quad \text{Equation 1}$$

This sequence may be repeated to measure the gain of the correction port for each delay cell. Measuring the gain of each delay cell correction port may allow for a faster convergence of the delay mismatch calibration algorithm described with reference to FIG. 4. However, in some embodiments, the calibration method described herein may be used based on the gain calculated for just one delay cell.

Other suitable operations may be used, and other suitable orders of operation may be used. One or more operations may be repeated, for example, for a pre-defined time period, for a pre-defined number of iterations, substantially continuously, at pre-defined time intervals, until a pre-defined condition holds true, or based on other criteria.

Figure 4:
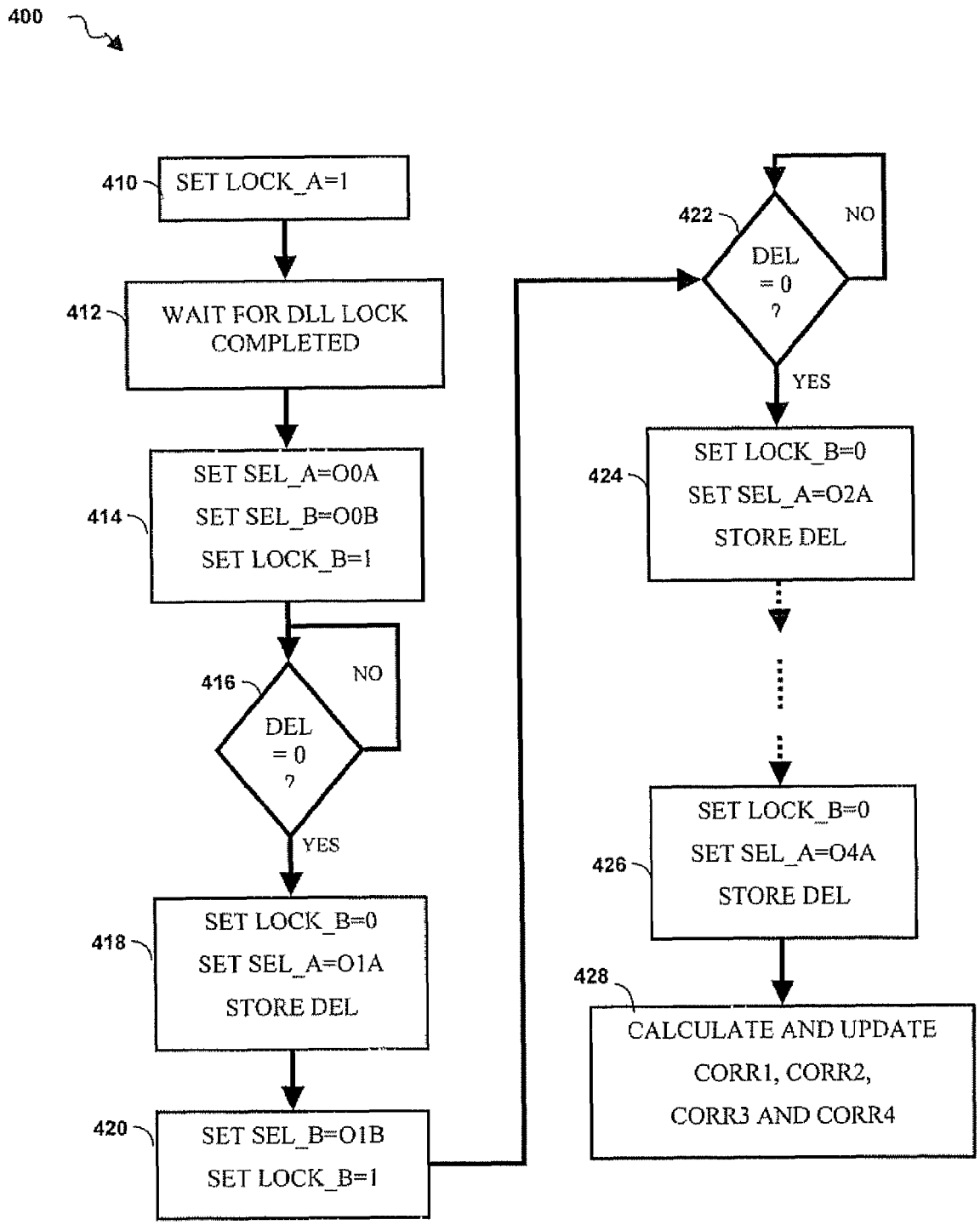
FIG. 4 is a schematic flow-chart of a method of calibrating delay in accordance with a demonstrative embodiment of the invention.

FIG. 4 is a schematic flow-chart of a method 400 of calibrating delay in accordance with a demonstrative embodiment of the invention. Operations of the method may be used, for example, by system 200 of FIG. 2 and/or by other suitable units, devices and/or systems. In some embodiments, method 400 may provide the delay mismatch correction itself, for example, as a continuation of the gain estimation method described with reference to FIG. 3.

As indicated at block 410, the main loop 208 is closed (lock_A=1) and let to lock (block 412). As indicated at block 414, outputs O0A and O0B are selected and fed to $CK_A$ and $CK_B$, respectively. The auxiliary DLL 209 is also closed (lock_B=1) and the system waits for DEL to go to zero as an indication of the achieved lock (block 416). Now, the signal $CK_A$ coming from O0A and the signal $CK_B$ coming from O0B may be aligned.

As indicated at block 418, at this point, the auxiliary loop 209 is opened (lock_B=0) and the output O1A from delay cell 211 is routed to $CK_A$ by the multiplexer 291. The time difference at the input of the auxiliary PFD 294 may represent the delay of the first cell 211 in the main DLL 208, including all the interconnections up to the output of the multiplexer 291. This delay is sampled and stored in DEL.

To measure the delay of the second cell 212 in the main DLL 208, the output O1B from the auxiliary DLL 209 may be selected for $CK_B$ (block 420). The auxiliary loop 209 is closed again to realign $CK_A$ and $CK_B$ (block 420). When the sampled value of DEL becomes zero (block 422), the auxiliary loop 209 is opened (block 424), and the output O2A from the main DLL is selected (block 424) so that the delay of cell 212 may be measured as integrated charge on $C_D$ and stored in DEL (block 424). As indicated at block 426, the same sequence may be repeated to measure the delay of each stage in the main DLL, with each repetition advancing the selected outputs.

At the end of the process, four measured delays, del1, del2, del3 and del4, may be available in the storage element DEL 296, corresponding to the four delay elements 211-214 of the main DLL 208. These values may be different due to delay mismatch. Accordingly, as indicated at block 428, the delay-mismatch calibration system may calculate the updated values for the corrections 221-224 to be applied to each DLL stage as a function of how much each measured delay deviates from the average. For example, the updated correction value for the first delay cell may be estimated according to the following equation, denoted Equation 2:

$$corr(n+1) = corr(n) + (del1 - DELavg)/\text{GAIN}; \quad \text{Equation 2}$$

$$DELavg = \sum_i deli / \text{total\_stages}$$

In the example architecture of FIG. 2, there are four stages in the main DLL, so i ranges from 1 to 4 in Equation 2, and total_stages=4. It can be shown that this algorithm converges so that at the end corr(n+1)=corr(n) and all the delays are ultimately equal.

In some embodiments, method 400 may be repeated until the updated correction parameters remain unchanged. Other suitable operations may be used, and other suitable orders of operation may be used. One or more operations may be repeated, for example, for a pre-defined time period, for a pre-defined number of iterations, substantially continuously, at pre-defined time intervals, until a pre-defined condition holds true, or based on other criteria.

In some embodiments, the calibration algorithm may be applied to a divide-by-125 architecture similar to the architecture shown in FIG. 2. For example, the main DLL may include eight stages; the ADC used to measure the delays may have ten bits; each delay cell correction value may be generated using a 6-bit digital-to-analog converter (DAC); the input frequency from the clock source may be 7.5 GHz; and the output frequency when the edge-combiner (multiplexer) is activated may be 7.5 GHz divided by 1.25, namely, 6 GHz. All the parameters of the delay cells (correction gain, main control gain, and intrinsic delay) may be statistically generated using Gaussian distribution, for example, with a 3sigma of 50 percent. In such a configuration, the spurs may be reduced from −28 dBc to −60 dBc, namely, more than 30 dBc reduction.

In some embodiments, the ADC is in close proximity and connected to a clock generation circuit, to allow utilization of the calibration scheme. The ADC may include capacitors and/or other structure, and the clock generation circuit may have RF routing to a VCO (e.g., cell with inductor).

Some embodiments may include a replica DLL close to the main DLL to allow utilization of the calibration technique. The DLL may have a structure (e.g., several identical delay cells repeated) associated with clock routing going from the VCO (circuit with the inductor) to the DLL, and form the DLL to each transmitter and/or receiver.

In some embodiments, calibration may run at power up or between packets, and monitoring TX/RX output (possibly through leakage) may indicate usage of the calibration scheme. In some embodiments, spurs with decreasing power over time are an indication of a delay calibration being performed. The frequency of the spurs may be estimated based on output frequency and frequency of VCO, for example, as measured with an antenna.

In some embodiments, the calibration technique is robust, since it relies on the relative measurement of the same quantity. The algorithm may force the measured delays to be equal; as the difference between the delays is reduced, so is the relative error introduced by any absolute errors due to non-idealities in the several circuit blocks used for the calibration, such as the PFD, the CP and the sampling capacitors. When the algorithm converges, any error may affect the measurement of each delay in the same manner, thus canceling out in the estimation of the updated corrections. This is true also for the estimation of the gain of the correction port. Even if each delay cell has a different gain for its correction port and the algorithm uses the gain estimated from one of them to update all the corrections, the initial error generated by a wrong estimated gain may converge to zero as the delay mismatches are corrected.

The calibration algorithm includes measuring the delay of one single cell at a time by moving the time reference generated by an auxiliary DLL. Some embodiments utilize the robustness of the technique (the effect of measurements error is canceled out) and the possibility of maximizing the circuit dynamic range for the measurement of one single delay. For example, since the system measures the delay of just one cell at a time, the full dynamic range of the auxiliary charge pump, sampling capacitor and ADC can be used for each measurement, thus relaxing their circuit design for a given resolution.

In some embodiments, the calibration technique allows the use of multi-phase DLLs or ring oscillators in high-spectral purity applications, such as new generation wireless radios, where requirements on spurs and/or I&Q matching are very stringent. The calibration of the multi-stage DLL allows the use of a fractional DLL based divider in high-speed, high process spread CMOS technologies without penalty on output spurs. The use of such fractional divider may allow for more flexible frequency plan for the local oscillator (LO) generation. Moreover, such divider can offset the frequency of the oscillator that is generating the LO signal from the output frequency of the PA, thus avoiding pulling issues.

Some embodiments may obviate the need to use single-sideband (SSB) mixing; the SSB mixer requires large inductors and considerable filtering in order to meet the stringent spur and image-rejection requirements. The calibration technique may therefore allow the use of fractional DLL based divider for this kind of applications, thus reducing the overall silicon area by eliminating inductors and additional filtering in the LO generation. This will improve integration, reduce cost and deliver a digital-friendly architecture that scales very well in future CMOS process nodes, thus reducing the product time-to-market.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

In some embodiments, the method described herein may be implemented in machine-executable instructions. These instructions may be used to cause a general-purpose or special-purpose processor that is programmed with the instructions to perform the operations described. Alternatively, the operations may be performed by specific hardware that may contain hardwired logic for performing the operations, for example, an application-specific integrated circuit (ASIC) or a field-programmable gate array (FPGA), or by any combination of programmed computer components and custom hardware components. Various general-purpose systems may be used with programs in accordance with the teachings herein, or it may prove convenient to construct a more specialized apparatus to perform the desired method.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid-state memory, magnetic tape, a removable computer diskette, a random access memory (RAM), a read-only memory (ROM), a rigid magnetic disk, and/or an optical disk. Some demonstrative examples of optical disks include compact disk-read only memory (CD-ROM), compact disk-read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A method of calibrating delay mismatch, the method comprising:
   aligning an output signal of a primary delay-locked loop having a plurality of delay elements with an auxiliary delay-locked loop having a replica structure of said primary delay-locked loop, to provide a reference time signal;
   measuring a delay of one of said delay elements based on a time difference between said reference time signal and an output time signal of said delay element being measured; and
   realigning the reference time signal in the auxiliary delay-locked loop for measuring a delay of a different one of said delay elements in the primary delay-locked loop.

2. The method according to claim 1, comprising selecting said output time signal of the delay element being measured to be the output signal of the primary delay-locked loop, using a multiplexer associated with said primary delay-locked loop.

3. The method according to claim 1, wherein said output signal of the primary delay-locked loop and said reference time signal from the auxiliary delay-locked looped are measured using the same topology.

4. The method according to claim 1, wherein said time difference is measured using a phase detector having a charge pump.

5. The method according to claim 1, comprising calculating a delay compensation value to be applied to said delay element via an associated correction port.

6. The method according to claim 5, wherein calculating said delay compensation comprises estimating an average gain of said correction port.

7. The method according to claim 5, wherein calculating said delay compensation comprises using an average gain value estimated for a correction port associated with a different one of said delay elements.

8. The method according to claim 5, comprising applying said delay compensation value to reduce relative delay mismatch between said delay elements.

9. An apparatus for calibrating delay mismatch, the apparatus comprising:
- a primary delay-locked loop having a plurality of delay elements to be calibrated for relative delay mismatch;
- an auxiliary delay-locked loop having a replica structure of said primary delay-locked loop, to provide a reference time signal for calibration by aligning with an output signal of the primary delay-locked loop; and
- a phase detector having a charge pump, to measure a delay of one of said delay elements based on a time difference between said reference time signal and an output time signal of said delay element being measured, wherein said reference time signal of the auxiliary delay-locked loop is able to be realigned with an output time signal of a different one of said delay elements in the primary delay-locked loop while using the same topology.

10. The apparatus according to claim 9, comprising a multiplexer associated with said primary delay-locked loop, to select said output time signal of said one of said delay elements to be the output signal of the primary delay-locked loop.

11. The apparatus according to claim 9, comprising wherein said plurality of delay elements of the primary delay-locked loop are each associated with a respective correction port configured to apply a delay compensation voltage.

12. The apparatus according to claim 11, comprising a memory element to store one or more delay compensation values respectively corresponding to said delay compensation voltage of the plurality of correction ports.

13. The apparatus according to claim 12, wherein said delay compensation values are calculated using an average gain value estimated for one of said correction ports.

* * * * *